(12) United States Patent
Kim

(10) Patent No.: US 10,692,553 B2
(45) Date of Patent: Jun. 23, 2020

(54) INTEGRATED CIRCUIT

(71) Applicant: SK hynix Inc., Gyeonggi-do (KR)

(72) Inventor: Ja-Young Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/440,403

(22) Filed: Jun. 13, 2019

(65) Prior Publication Data

US 2020/0090714 A1    Mar. 19, 2020

(30) Foreign Application Priority Data

Sep. 18, 2018   (KR) .................... 10-2018-0111536

(51) Int. Cl.
*G11C 7/00* (2006.01)
*G11C 7/22* (2006.01)

(52) U.S. Cl.
CPC .............. *G11C 7/222* (2013.01); *G11C 7/227* (2013.01)

(58) Field of Classification Search
CPC ................................ G11C 7/222; G11C 7/227
See application file for complete search history.

(56) References Cited

U.S. PATENT DOCUMENTS

| 7,961,018 B2 | 6/2011 | Hyun et al. | |
| 10,320,398 B2* | 6/2019 | Jeon | H03L 7/10 |
| 2009/0109770 A1* | 4/2009 | Sugishita | G06F 13/1689 |
| | | | 365/193 |
| 2015/0029800 A1* | 1/2015 | Iijima | H03K 19/0016 |
| | | | 365/193 |
| 2015/0235683 A1* | 8/2015 | Song | G11C 7/1093 |
| | | | 365/189.05 |
| 2018/0137901 A1* | 5/2018 | Jung | G11C 7/222 |
| 2018/0350415 A1* | 12/2018 | Yoon | G11C 7/1066 |
| 2019/0267057 A1* | 8/2019 | Park | G11C 7/109 |

* cited by examiner

Primary Examiner — Toan K Le
(74) Attorney, Agent, or Firm — IP & T Group LLP

(57) ABSTRACT

An integrated circuit includes: a delay circuit suitable for delaying one or more input signals; a toggle sensing circuit suitable for sensing whether or not the one or more input signals toggle; and a replica delay circuit suitable for delaying one or more clock signals in a section where no toggle of the one or more input signals is sensed by the toggle sensing circuit.

12 Claims, 3 Drawing Sheets

FIG. 2
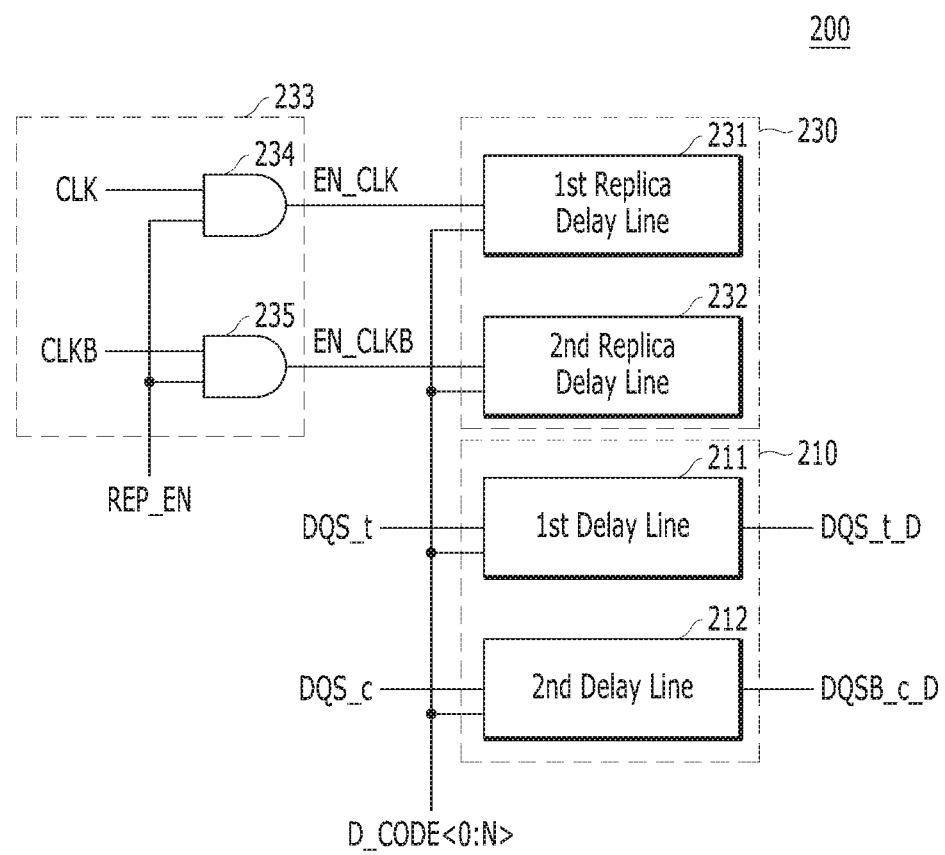
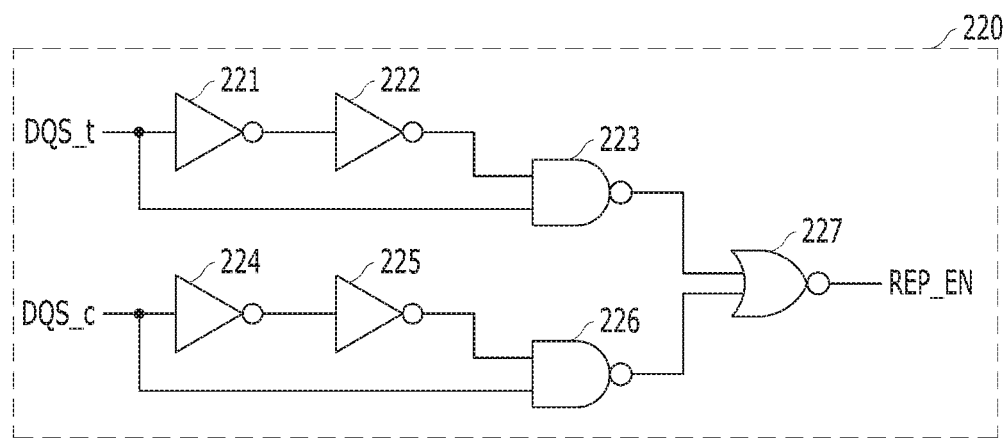

INTEGRATED CIRCUIT

CROSS-REFERENCE TO RELATED APPLICATIONS

The present application claims priority under 35 U.S.C. § 119(a) to Korean Patent Application No. 10-2018-0111536, filed on Sep. 18, 2018, which is incorporated herein by reference in its entirety.

BACKGROUND

1. Field

Various embodiments of the present invention relate to an integrated circuit, and more particularly, to an integrated circuit using strobe signals.

2. Description of the Related Art

In a system including plural integrated circuit chips, when data are exchanged at high speed between integrated circuit chips, strobe signals are also exchanged along with the data. A strobe signal, referred to as an echo clock, is required to high speed data transfer between integrated circuit chips for securing signal integrity of the data. As a representative example, almost all types of memory devices use strobe signals along with data to strobe the data when the data are exchanged. The data and the strobe signals are required to be properly aligned for the stability of data transmission and reception.

FIG. 1 is a diagram showing a waveform of data DQ and strobe signals DQS_t and DQS_c of a conventional memory device. In the figure, the solid line represents a strobe signal DQS_t, and the dotted line represents a complementary strobe signal DQS_c. FIG. 1 shows that the edges of the strobe signals DQS_t and DQS_c are not aligned with the center of the data DQ. In this case, the strobe signals DQS_t and DQS_c are required to be delayed by an amount '101' in order to align the edges of the strobe signals DQS_t and DQS_c with the center of the data DQ. Since the strobe signals DQS_t and DQS_c are signals that toggle at high speed, a large amount of current is consumed in the process of delaying the strobe signals DQS_t and DQS_c, which may generate a lot of power noise in the memory device.

SUMMARY

Embodiments of the present invention are directed to an integrated circuit for eliminating power noise generated in the process of delaying strobe signals.

In accordance with an embodiment of the present invention, an integrated circuit includes: a delay circuit suitable for delaying one or more input signals; a toggle sensing circuit suitable for sensing whether or not the one or more input signals toggle; and a replica delay circuit suitable for delaying one or more clock signals in a section where no toggle of the one or more input signals is sensed by the toggle sensing circuit.

In accordance with another embodiment of the present invention, an integrated circuit includes: a delay line suitable for delaying a strobe signal; a toggle sensing circuit suitable for sensing a toggle of the strobe signal; an input control circuit suitable for selectively transferring a clock signal in a section where no toggle of the strobe signal is sensed by the toggle sensing circuit; and a replica delay circuit suitable for delaying the clock signal transferred from the input control circuit.

In accordance with another embodiment of the present invention, a method for operating an integrated circuit includes: delaying a strobe signal through a delay line; sensing a section in which there is no toggle of the delayed strobe signal; and delaying a clock signal through a replica delay line in the section.

BRIEF DESCRIPTION OF THE DRAWINGS

FIG. 2 is a block diagram illustrating an integrated circuit in accordance with an embodiment of the present invention.

DETAILED DESCRIPTION

Figure 1:
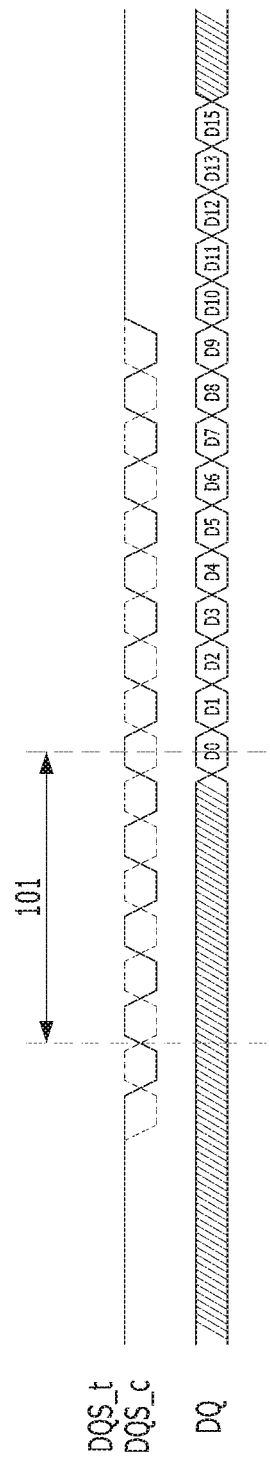
FIG. 1 is a diagram showing a waveform of a data and strobe signals of a conventional memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations thereof but do not preclude the presence or addition of one or more other features, numbers, steps, operations, elements, components, and/or combinations thereof.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Hereinafter, the various embodiments of the present invention will be described in detail with reference to the attached drawings.

FIG. 2 is a block diagram illustrating an integrated circuit 200 in accordance with an embodiment of the present invention.

Referring to FIG. 2, the integrated circuit 200 may include a delay circuit 210, a toggle sensing circuit 220, and a replica delay circuit 230.

The delay circuit 210 may delay a strobe signal DQS_t and a complementary strobe signal DQS_c. Herein, it is exemplarily illustrated that the strobe signals DQS_t and DQS_c are used as input signals delayed by the delay circuit 210. However, it is obvious to those skilled in the art that the types and the number of the input signals delayed by the delay circuit 210 may be different. The delay circuit 210 may include a first delay line 211 for delaying the strobe signal DQS_t to output as a delayed strobe signal DQS_t_D (hereinafter, referred to merely as a strobe signal) and a second delay line 212 for delaying the complementary strobe signal DQS_c to output as a delayed complementary strobe signal DQS_t_D (hereinafter, referred to merely as a complementary strobe signal). A delay amount of the first delay line 211 and the second delay line 212 may be adjusted based on a delay code D_CODE<0:N>. The delay circuit 210 may be used to align the edges of the strobe signals DQS_t_D and DQS_c_D with the center of data, e.g., DQ shown in FIG. 1, by delaying the strobe signals DQS_t and DQS_c.

The toggle sensing circuit 220 may sense a toggle of the one or more input signals DQS_t and DQS_c to be delayed by the delay circuit 210. When both the strobe signals DQS_t and DQS_c maintain a first logic level (e.g., a logic high level) for a predetermined time or more, the toggle sensing circuit 220 may determine that the strobe signals DQS_t and DQS_c do not toggle, and then may activate a replica toggle enable signal REP_EN at a logic high level. When the replica toggle enable signal REP_EN is at a logic high level, it may represent that the strobe signals DQS_t and DQS_c do not toggle. On the contrary, when the replica toggle enable signal REP_EN is at a logic low level, it may represent that the strobe signals DQS_t and DQS_c toggle.

The toggle sensing circuit 220 may include inverters 221 to 225, NAND gates 223 and 226, and a NOR gate 227. The inverters 221 and 222 may delay the strobe signal DQS_t. The NAND gate 223 may receive the strobe signal DQS_t and an output signal of the inverter 222. The inverters 224 and 225 may delay the complementary strobe signal DQS_c. The NAND gate 226 may receive the complementary strobe signal DQS_c and an output signal of the inverter 225. The NOR gate 227 may receive output signals of the NAND gates 223 and 226 to output the replica toggle enable signal REP_EN.

When the strobe signal DQS_t maintains a logic high level for a predetermined time or more, the output signal of the NAND gate 223 may be at a logic low level. Similarly, when the complementary strobe signal DQS_c maintains a logic high level for the predetermined time or more, the output signal of the NAND gate 226 may be at a logic low level. When the output signals of the NAND gates 223 and 226 are all at a logic low level, the replica toggle enable signal REP_EN may have a logic high level. The predetermined time may correspond to the delay amount by the inverters 221 and 222 (or the inverters 221 and 222).

The replica delay circuit 230 may delay clock signals CLK and CLKB in a section where the strobe signals DQS_t and DQS_c do not toggle, that is, in a section where the replica toggle enable signal REP_EN is at a logic high level. Since the delay circuit 210 is exemplarily illustrated to delay the strobe signals DQS_t and DQS_c inputted differentially, the replica delay circuit 230 is also illustrated to delay the clock signals CLK and CLKB inputted thereto differentially. A frequency of the strobe signals DQS_t and DQS_c while they are toggling and a frequency of the clock signals CLK and CLKB may be the same. The replica delay circuit 230 may include a first replica delay line 231 and a second replica delay line 232. The replica delay circuit 230 may be used to uniformly maintain an amount of current consumed by the integrated circuit 200 to reduce the power noise. That is, a smaller amount of current may be consumed in a section where the delay circuit 210 consumes a large amount of current, and a larger amount of current may be consumed in the section where the delay circuit 210 consumes a small amount of current. The first replica delay line 231 and the second replica delay line 232 may have the same configuration as the first delay line 211 and the second delay line 212. A delay amount of the first replica delay line 231 and the second replica delay line 232 may be adjusted based on the delay code D_CODE<0:N>.

An input control circuit 233 may transfer the clock signal CLK and the complementary clock signal CLKB to the first replica delay line 231 and the second replica delay line 232 in response to the replica toggle enable signal REP_EN. In other words, when the replica toggle enable signal REP_EN is activated at a logic high level, the clock signal CLK may be transferred as a sampled clock signal EN_CLK to the first replica delay line 231 and the complementary clock signal CLKB may be transferred as a sampled complementary clock signal EN_CLKB to the second replica delay line 232. When the replica toggle enable signal REP_EN is deactivated at a logic low level, the sampled clock signals EN_CLK and EN_CLKB may be fixed to a logic low level. The input control circuit 233 may include an AND gate 234 which receives the clock signal CLK and the replica toggle enable signal REP_EN to generate the sampled clock signal EN_CLK to be transferred to the first replica delay line 231, and an AND gate 235 which receives the complementary clock signal CLKB and the replica toggle enable signal REP_EN to generate the sampled complementary clock signal EN_CLKB to be transferred to the second replica delay line 232.

The first replica delay line 231 may delay the sampled clock signal EN_CLK transferred from the input control circuit 233. As described above, the first replica delay line 231 may have the same configuration as the first delay line 211, and may have a delay value that is adjusted based on the delay code D_CODE<0:N> just as in the delay line 211.

Similarly, the second replica delay line 232 may delay the sampled complementary clock signal EN_CLKB transferred from the input control circuit 233. As described above, the second replica delay line 232 may have the same configuration as the second delay line 212, and may have a delay value that is adjusted based on the delay code D_CODE<0:N> just as in the second delay line 212.

Figure 3:
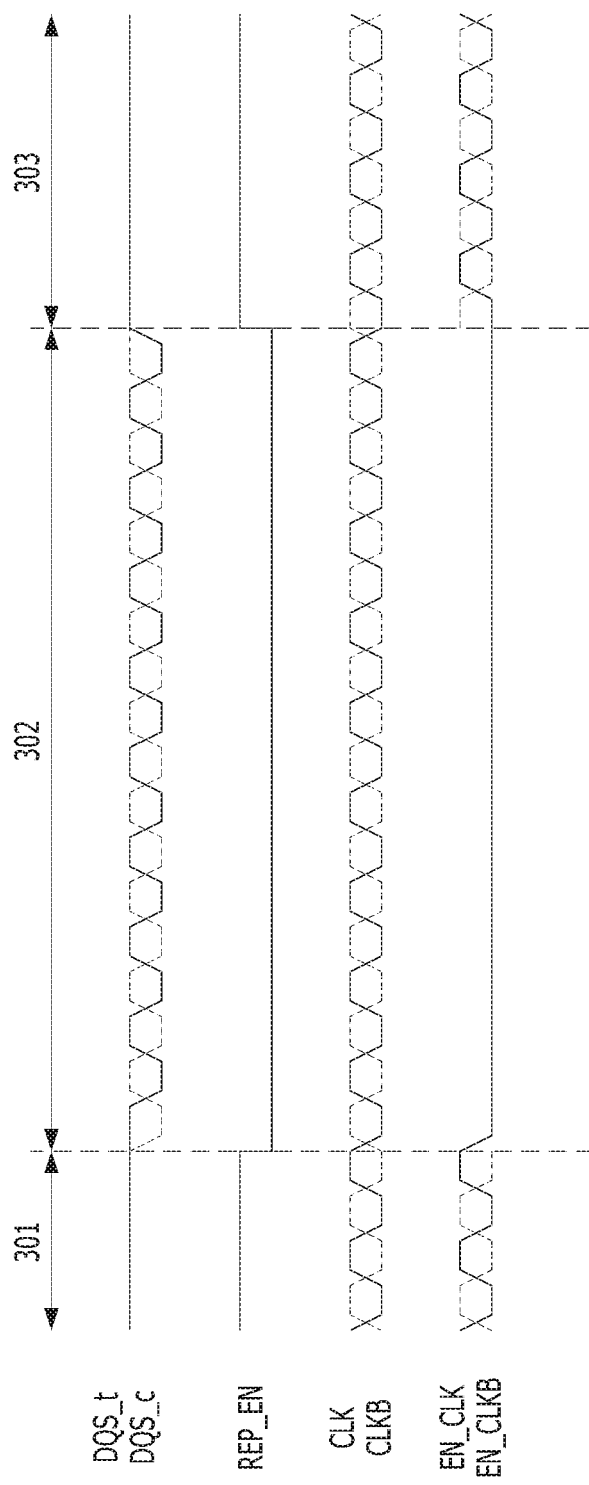
FIG. 3 is a timing diagram for describing an operation of the integrated circuit shown in FIG. 2.

FIG. 3 is a timing diagram for describing an operation of the integrated circuit 200 shown in FIG. 2.

Referring to FIG. 3, the strobe signals DQS_t_D and DQS_c_D may not toggle in a section 301. In this case, the replica toggle enable signal REP_EN may have a logic high level, and the sampled clock signals EN_CLK and EN_CLKB transferred to the first replica delay line 231 and the second replica delay line 232 may toggle. Therefore, the first delay line 211 and the second delay line 212 for delaying the strobe signals DQS_t and DQS_c may consume a smaller amount of current, while the first replica delay line 231 and the second replica delay line 232 for delaying the sampled clock signals EN_CLK and EN_CLKB may consume a larger amount of current.

In a section 302, the strobe signals DQS_t_D and DQS_c_D may toggle. In this case, the replica toggle enable signal REP_EN may have a logic low level, and the sampled clock signals EN_CLK and EN_CLKB transferred to the first replica delay line 231 and the second replica delay line 232 may be fixed to a logic low level. Therefore, a larger amount of current may be consumed in the first delay line 211 and the second delay line 212 that delay the strobe signals DQS_t and DQS_c, and a smaller amount of current may be consumed in the first replica delay line 231 and the second replica delay line 232 that delay the sampled clock signals EN_CLK and EN_CLKB.

In a section 303, the strobe signals DQS_t_D and DQS_c_D may not toggle. In this case, the replica toggle enable signal REP_EN may have a logic high level, and the sampled clock signals EN_CLK and EN_CLKB transferred to the first replica delay line 231 and the second replica delay line 232 may toggle. That is, in the section 303, the integrated circuit 200 may operate substantially the same as the section 301.

Since the total amount of current consumed by the integrated circuit in a section where the strobe signals DQS_t_D and DQS_c_D toggle and a section where the strobe signals DQS_t_D and DQS_c_D do not toggle may be kept constant, the current consumption amount of the integrated circuit may not change abruptly during transition of the sections 301 to 303. As a result, the power noise may not be generated in the integrated circuit.

According to the embodiment of the present invention, strobe signals may be delayed without power noise.

While the present invention has been described with respect to the specific embodiments, it will be apparent to those skilled in the art that various changes and modifications may be made without departing from the spirit and scope of the invention as defined in the following claims.

What is claimed is:

1. An integrated circuit, comprising:
a delay circuit suitable for delaying one or more input signals;
a toggle sensing circuit suitable for sensing whether or not the one or more input signals toggle; and
a replica delay circuit suitable for delaying one or more clock signals in a section where no toggle of the one or more input signals is sensed by the toggle sensing circuit.

2. The integrated circuit of claim 1, wherein the one or more input signals include a strobe signal and a complementary strobe signal.

3. The integrated circuit of claim 2, wherein the one or more clock signals include a clock signal and a complementary clock signal.

4. The integrated circuit of claim 3, wherein the strobe signal and the complementary strobe signal are signals for strobing data received by the integrated circuit, and
when the strobe signal and the complementary strobe signal toggle, the strobe signal and the complementary strobe signal have the same frequency as a frequency of the clock signal and the complementary clock signal.

5. The integrated circuit of claim 3, wherein the delay circuit includes:
a delay line suitable for delaying the strobe signal; and
a complementary delay line suitable for delaying the complementary strobe signal.

6. The integrated circuit of claim 5, wherein the replica delay circuit includes:
a replica delay line having the same configuration as the delay line; and
a replica complementary delay line having the same configuration as the complementary delay line.

7. The integrated circuit of claim 6, further comprising:
an input control circuit suitable for selectively transferring the clock signal and the complementary clock signal to the replica delay line and the replica complementary delay line in response to a replica toggle enable signal generated by the toggle sensing circuit.

8. The integrated circuit of claim 7, wherein a delay amount of each of the delay line, the complementary delay line, the replica delay line, and the replica complementary delay line is adjusted based on a delay code.

9. The integrated circuit of claim 7, wherein, when both the strobe signal and the complementary strobe signal maintain a first logic level for a predetermined time or more, the replica toggle enable signal is activated.

10. The integrated circuit of claim 7, wherein the toggle sensing circuit includes:
a first NAND gate suitable for receiving the strobe signal and a signal obtained by delaying the strobe signal by a predetermined time;
a second NAND gate suitable for receiving the complementary strobe signal and a signal obtained by delaying the complementary strobe signal by the predetermined time; and
a NOR gate suitable for receiving an output signal of the first NAND gate and an output signal of the second NAND gate to output the replica toggle enable signal.

11. The integrated circuit of claim 1, wherein the integrated circuit is a memory device, and
the one or more input signals include a strobe signal and a complementary strobe signal for strobing a data inputted to the memory device.

12. An integrated circuit, comprising:
a delay line suitable for delaying a strobe signal;
a toggle sensing circuit suitable for sensing a toggle of the strobe signal;
an input control circuit suitable for selectively transferring a clock signal in a section where no toggle of the strobe signal is sensed by the toggle sensing circuit; and
a replica delay circuit suitable for delaying the clock signal transferred from the input control circuit.

* * * * *